(12) United States Patent
Shimase et al.

(10) Patent No.: US 11,181,361 B2
(45) Date of Patent: Nov. 23, 2021

(54) OPTICAL MEASUREMENT METHOD, OPTICAL MEASUREMENT DEVICE, OPTICAL MEASUREMENT PROGRAM, AND RECORDING MEDIUM FOR RECORDING OPTICAL MEASUREMENT PROGRAM

(71) Applicant: HAMAMATSU PHOTONICS K.K., Hamamatsu (JP)

(72) Inventors: Akira Shimase, Hamamatsu (JP); Kazuhiro Hotta, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/766,069

(22) PCT Filed: Sep. 5, 2018

(86) PCT No.: PCT/JP2018/032877
§ 371 (c)(1),
(2) Date: May 21, 2020

(87) PCT Pub. No.: WO2019/102683
PCT Pub. Date: May 31, 2019

(65) Prior Publication Data
US 2020/0333134 A1 Oct. 22, 2020

(30) Foreign Application Priority Data

Nov. 27, 2017 (JP) .............................. JP2017-226567

(51) Int. Cl.
*G01B 11/24* (2006.01)
*G01N 21/956* (2006.01)
(Continued)

(52) U.S. Cl.
CPC ........... *G01B 11/24* (2013.01); *G01N 21/956* (2013.01); *G01N 2021/95676* (2013.01); *G01N 2201/06113* (2013.01); *G01N 2201/10* (2013.01)

(58) Field of Classification Search
CPC ......... G01B 11/24; G01N 2021/95676; G01N 21/956; G01N 2201/06113; G01N 2201/10; G01R 31/26; G01R 31/28; G01R 31/302
(Continued)

(56) References Cited

U.S. PATENT DOCUMENTS 6,563,136 B2 * 5/2003 Kunii .................. H01L 27/1214
257/72
2004/0189335 A1 9/2004 Desplats et al.
(Continued)

FOREIGN PATENT DOCUMENTS

EP 2439549 A2 4/2012
JP H10-150086 A 6/1998
(Continued)

OTHER PUBLICATIONS

International Preliminary Report on Patentability dated Jun. 11, 2020 for PCT/JP2018/032877.

*Primary Examiner* — Tri T Ton
(74) *Attorney, Agent, or Firm* — Faegre Drinker Biddle & Reath LLP (57) ABSTRACT

A semiconductor device inspection apparatus includes: a light sensor that detects light from a semiconductor device as a DUT to which an electric signal has been input; an optical system that guides light from the semiconductor device to the light sensor; and a control device electrically connected to the light sensor. The control device includes: a data reading unit that reads mask data indicating a mask layout of the semiconductor device; a search unit that (Continued)

searches for a position of a transistor in the semiconductor device on the basis of polygon data of a gate layer of the semiconductor device included in the mask data; a setting unit that sets the searched position of the transistor as an optical measurement target position; and a measurement unit that performs optical measurement for the set optical measurement target position to acquire a measurement result.

15 Claims, 10 Drawing Sheets (58) Field of Classification Search
USPC .................................................. 356/601–640
See application file for complete search history.

(56) References Cited

U.S. PATENT DOCUMENTS

| | | |
|---|---|---|
| 2014/0067319 A1 | 3/2014 | Ogura |
| 2015/0199583 A1 | 7/2015 | Nagatomo et al. |

FOREIGN PATENT DOCUMENTS

| | | |
|---|---|---|
| JP | 2007-064975 A | 3/2007 |
| JP | 2009-115458 A | 5/2009 |
| JP | 2017-072542 A | 4/2017 |

* cited by examiner

OPTICAL MEASUREMENT METHOD, OPTICAL MEASUREMENT DEVICE, OPTICAL MEASUREMENT PROGRAM, AND RECORDING MEDIUM FOR RECORDING OPTICAL MEASUREMENT PROGRAM

TECHNICAL FIELD

The present disclosure relates to an optical measurement method, an optical measurement apparatus, an optical measurement program, and a recording medium having the optical measurement program recorded thereon which perform optical measurement for a semiconductor device.

BACKGROUND ART

In the related art, an optical probing technique (see the following Patent Literature 1) called electro-optical probing (EOP) or a time-resolved emission measurement technique (see the following Patent Literature 2) called time-resolved imaging emission microscopy (TRIEM) has been known as a technique for inspecting a semiconductor integrated circuit. For example, in the EOP, a temporal change in a depletion layer due to the driving of a semiconductor device is acquired by measuring a temporal change in the reflectance of probe light. In addition, in the TRIEM, the generation timing of hot carriers flowing between a source and a drain due to the driving of a semiconductor device is measured from a temporal change in light emission intensity.

CITATION LIST

Patent Literature

Patent Literature 1: Japanese Unexamined Patent Publication No. 2007-064975
Patent Literature 2: Japanese Unexamined Patent Publication No. H10-150086

SUMMARY OF INVENTION

Technical Problem

In the above-mentioned inspection technique, it is necessary to appropriately set an optical measurement target position on a semiconductor device in order to analyze whether or not the semiconductor device has a defect. Here, in some cases, at the time of defect analysis for a semiconductor device, an operator does not have design data related to the arrangement of elements mounted on the semiconductor device. In contrast, in many cases, the operator has mask data indicating a mask pattern used to manufacture the semiconductor device.

An object of an embodiment is to provide an optical measurement method, an optical measurement apparatus, an optical measurement program, and a recording medium having the optical measurement program recorded thereon that can appropriately set the position of an optical measurement target to easily perform defect analysis for a semiconductor device.

Solution to Problem

According to an aspect of the present invention, there is provided an optical measurement method for performing optical measurement for a semiconductor device. The optical measurement method includes: a data reading step of reading mask data indicating a mask layout of the semiconductor device; a search step of searching for a position of a transistor in the semiconductor device on the basis of polygon data indicating a pattern and arrangement of a gate layer in the semiconductor device, the polygon data being included in the mask data; a setting step of setting the position of the transistor searched in the search step as an optical measurement target position; and a measurement step of performing the optical measurement for the optical measurement target position set in the setting step to acquire a measurement result.

Alternatively, according to another aspect of the present invention, there is provided an optical measurement apparatus that performs optical measurement for a semiconductor device. The optical measurement apparatus includes: a light detector configured to detect light from the semiconductor device to which a test signal has been input; an optical system for guiding light from the semiconductor device to the light detector; and a control device that is electrically connected to the light detector. The control device includes: a data reading means for reading mask data indicating a mask layout of the semiconductor device; a search means for searching for a position of a transistor in the semiconductor device on the basis of polygon data indicating a pattern and arrangement of a gate layer in the semiconductor device, the polygon data being included in the mask data; a setting means for setting the position of the transistor searched by the search means as an optical measurement target position; and a measurement means for performing the optical measurement for the optical measurement target position set by the setting means to acquire a measurement result.

Alternatively, according to still another aspect of the present invention, there is provided an optical measurement program that causes a computer to function as: a data reading means for reading mask data indicating a mask layout of a semiconductor device; a search means for searching for a position of a transistor in the semiconductor device on the basis of polygon data indicating a pattern and arrangement of a gate layer in the semiconductor device, the polygon data being included in the mask data; a setting means for setting the position of the transistor searched by the search means as an optical measurement target position; and a measurement means for performing optical measurement for the optical measurement target position set by the setting means to acquire a measurement result.

Alternatively, according to still another aspect of the present invention, there is provided a computer-readable recording medium on which the optical measurement program is recorded.

According to any of the above-described aspects, the position of a transistor in a semiconductor device is searched using polygon data related to a gate layer included in mask data of the semiconductor device to be measured and the searched position is set as an optical measurement target position. Then, optical measurement is performed for the set position. Therefore, even in a case in which the operator has only mask data, it is possible to appropriately set a part which is to be measured or is easy to measure in order to perform defect analysis for a semiconductor device. As a result, it is possible to easily analyze a defective part using the measurement result.

Advantageous Effects of Invention

According to the embodiment, the optical measurement target position is appropriately set to easily perform defect analysis for a semiconductor device.

DESCRIPTION OF EMBODIMENTS

Hereinafter, embodiments of the present invention will be described in detail with reference to the accompanying drawings. Incidentally, in the following description, the same elements or elements having the same function are denoted by the same reference numerals and the description thereof will not be repeated.

Figure 1:
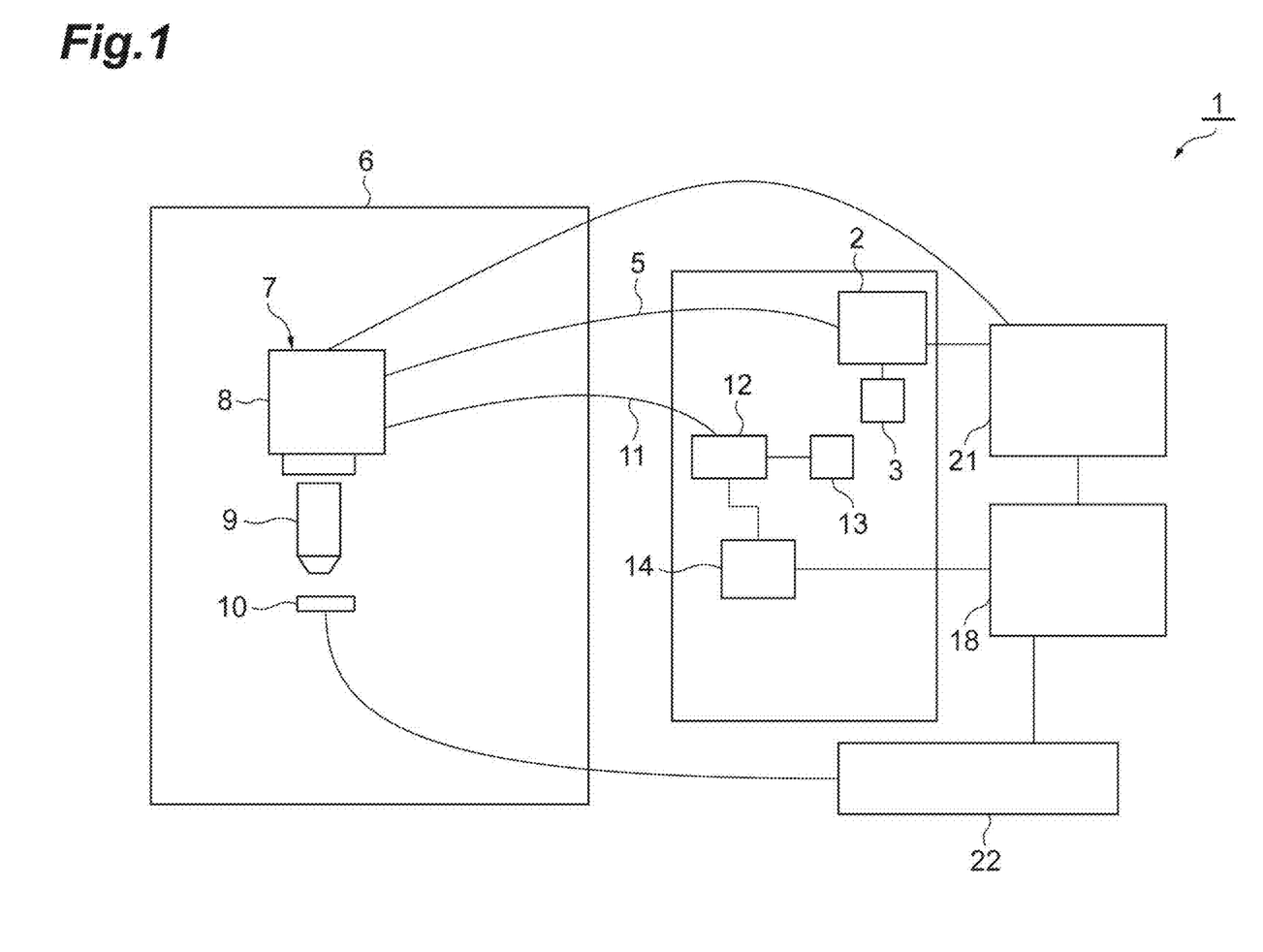
FIG. 1 is a block diagram schematically illustrating the configuration of a semiconductor device inspection apparatus 1 which is an optical measurement apparatus according to an embodiment.

FIG. 1 is a block diagram schematically illustrating the configuration of a semiconductor device inspection apparatus 1 which is an optical measurement apparatus according to an embodiment. As illustrated in FIG. 1, the semiconductor device inspection apparatus 1 is an apparatus that performs optical measurement for a semiconductor device 10 which is a device under test (DUT) as a measurement target to perform inspection such as the specification of a part (defective part) in which a defect occurs in the semiconductor device 10.

Examples of the semiconductor device 10 include individual semiconductor elements (discrete) including diodes or power transistors, optoelectronic elements, and sensors/actuators, logic large scale integrations (LSIs) including transistors with a metal-oxide-semiconductor (MOS) structure or a bipolar structure, memory elements, linear integrated circuits (ICs), and hybrid devices thereof. In addition, the semiconductor device 10 may be, for example, a package including a semiconductor device or a composite substrate.

The semiconductor device inspection apparatus 1 includes a light source 2. The light source 2 is an incoherent light source, such as a light emitting diode (LED) light source or a super luminescent diode (SLD) light source, or a coherent light source, such as a laser. The light source 2 is operated by a first power supply 3 and emits light with which the semiconductor device 10 is to be irradiated. The light emitted from the light source 2 is guided to a scanning optical system 7 through an optical fiber 5 for probe light.

The scanning optical system (optical scanning unit) 7 includes a scanning head 8 and a lens system 9 and can be operated so as to two-dimensionally scan a desired position on the semiconductor device 10 with the light guided through the optical fiber 5. Incidentally, the scanning optical system 7 and the semiconductor device 10 are provided in a dark box 6.

Light reflected from the semiconductor device 10 when the semiconductor device 10 is irradiated with the light emitted from the light source 2 is guided to a light sensor (light detector) 12 through an optical system including the lens system 9, the scanning head 8, and an optical fiber 11 for return light. The light sensor 12 is operated by a second power supply 13 provided separately from the first power supply 3, detects the reflected light, and outputs a detection signal indicating the intensity level of the reflected light. For example, the light sensor 12 includes a photo-detection element, such as a photomultiplier tube, a photodiode (PD), or an avalanche photodiode (APD). The light sensor 12 is electrically connected to a control device 18 through an amplifier 14 and an amplified detection signal output from the light sensor 12 is input to the control device 18. In addition, the control device 18 is electrically connected to a beam scanning controller 21 and a tester unit 22. The control device 18 acquires measurement results including waveform data of the intensity of the reflected light on the basis of the detection signal that has been acquired continuously in time and outputs the measurement results to an output device, such as a display, an external storage medium, or the like.

The beam scanning controller 21 controls the light source 2 and the scanning optical system 7 on the basis of an instruction signal from the control device 18. The tester unit 22 is, for example, a tester or a pulse generator and applies a predetermined electric signal (test signal) to the semiconductor device 10 on the basis of an instruction signal from the control device 18. Then, a predetermined part of the semiconductor device 10, to which the electric signal has been applied, is two-dimensionally scanned with the light from the light source 2 and reflected light generated from the predetermined part by the scanning is detected. In this way, the semiconductor device 10 is inspected.

Next, the configuration of the control device 18 will be described in detail.

Figure 2:
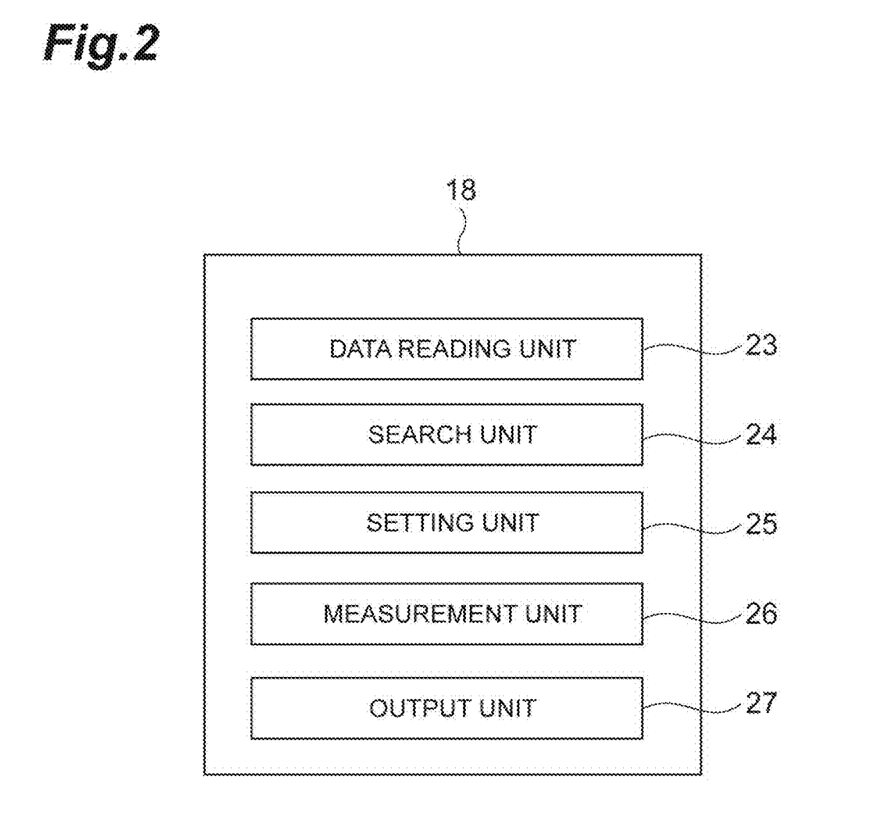
FIG. 2 is a block diagram illustrating the functional configuration of a control device 18 illustrated in FIG. 1.

First, the functional configuration of the control device 18 will be described with reference to FIG. 2. As illustrated in FIG. 2, the control device 18 includes, as functional components, a data reading unit (data reading means) 23, a search unit (search means) 24, a setting unit (setting means) 25, a measurement unit (measurement means) 26, and an output unit 27.

Figure 3:
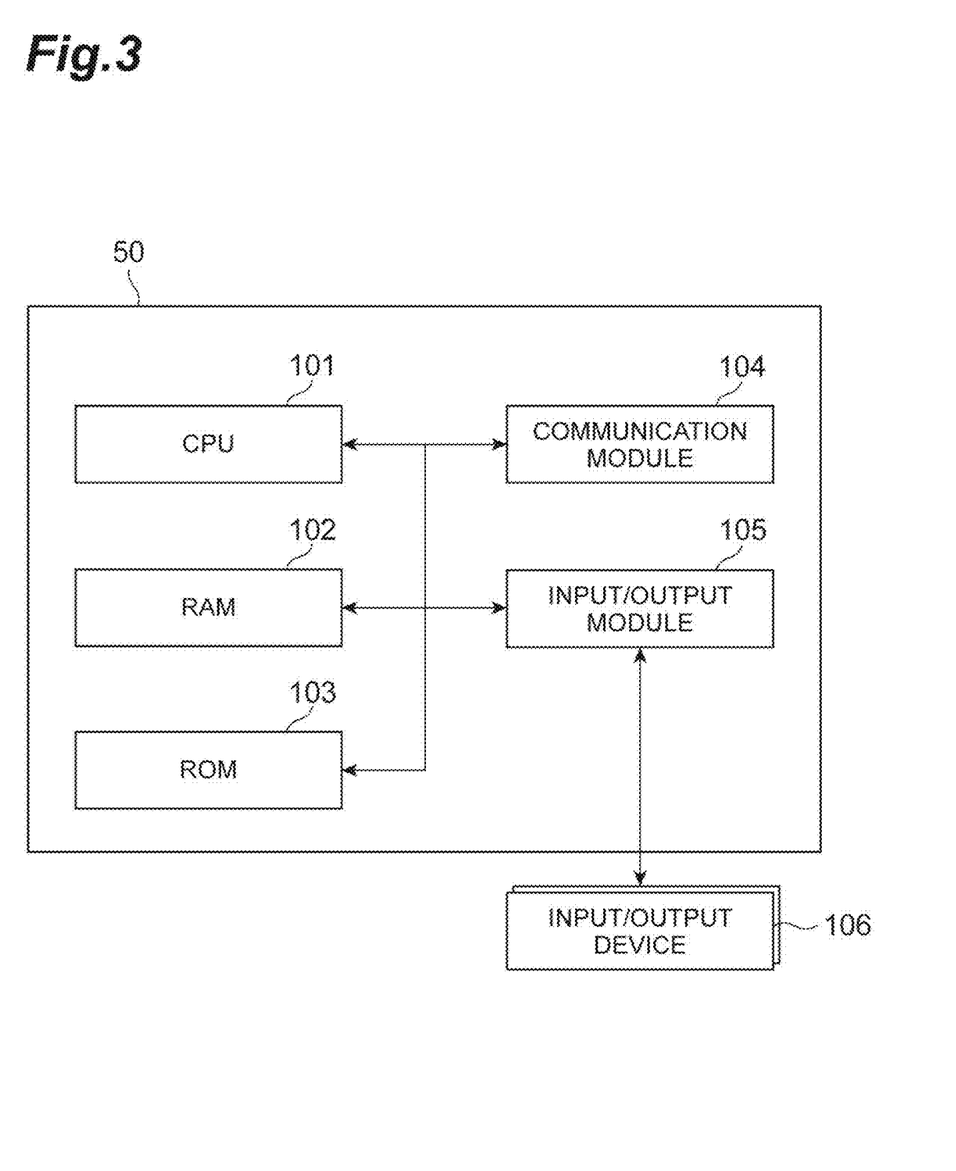
FIG. 3 is a diagram illustrating the hardware configuration of the control device 18 illustrated in FIG. 1.

FIG. 3 is a block diagram illustrating the hardware configuration of the control device 18. As illustrated in FIG. 3, the control device 18 is implemented by an arithmetic device 50 and an input/output device 106, such as a keyboard, a mouse, a display device, a data reading device, or a storage medium drive device, connected to the outside of the arithmetic device 50. For example, the arithmetic device 50 is physically a computer including a central processing unit (CPU) 101 which is a processor, a random access memory (RAM) 102 or a read only memory (ROM) 103 which is a recording medium, a communication module 104, and an input/output module 105 which are electrically connected to each other. Each of the functional units of the control device 18 is implemented by reading an optical measurement program according to the embodiment onto hardware, such as the CPU 101 and the RAM 102, operating, for example, the communication module 104 and the input/output module 105, and reading and writing data from and to the RAM 102 under the control of the CPU 101.

Next, each of the functional units of the control device 18 will be described in detail.

The data reading unit 23 has a function of reading mask data that is data indicating a mask layout of the semiconductor device 10 as a DUT from the outside. Here, the mask data is generally data indicating the layout (shape and arrangement) of a photomask on a semiconductor substrate which is required when the semiconductor device 10 is manufactured and is data of a stream data format indicating the layout of a mask for each layer of the semiconductor device 10. The mask data is created by an engineer who is a designer when a semiconductor device is designed and is used by an operator who is a manufacturer when a semiconductor device is manufactured. Examples of the standard format of the mask data include Graphic Data System (GDS (registered trademark)) and Open Artwork System Interchange Standard (OASIS (registered trademark)). The data reading unit 23 may read mask data including the mask layouts of all of the layers of the semiconductor device 10. The data reading unit 23 reads at least mask data including the mask layout of a gate layer of the semiconductor device 10.

The search unit 24 searches for the position of a transistor which is suitable for optical measurement for defect analysis or where optical measurement is easily performed in the semiconductor device 10 on the basis of polygon data indicating the mask layout of the gate layer included in the mask data with reference to the mask data read by the data reading unit 23. That is, the search unit 24 searches for, for example, the position of a transistor with a relatively high driving capability in the semiconductor device 10 on the basis of the polygon data included in the mask data.

Figure 4:
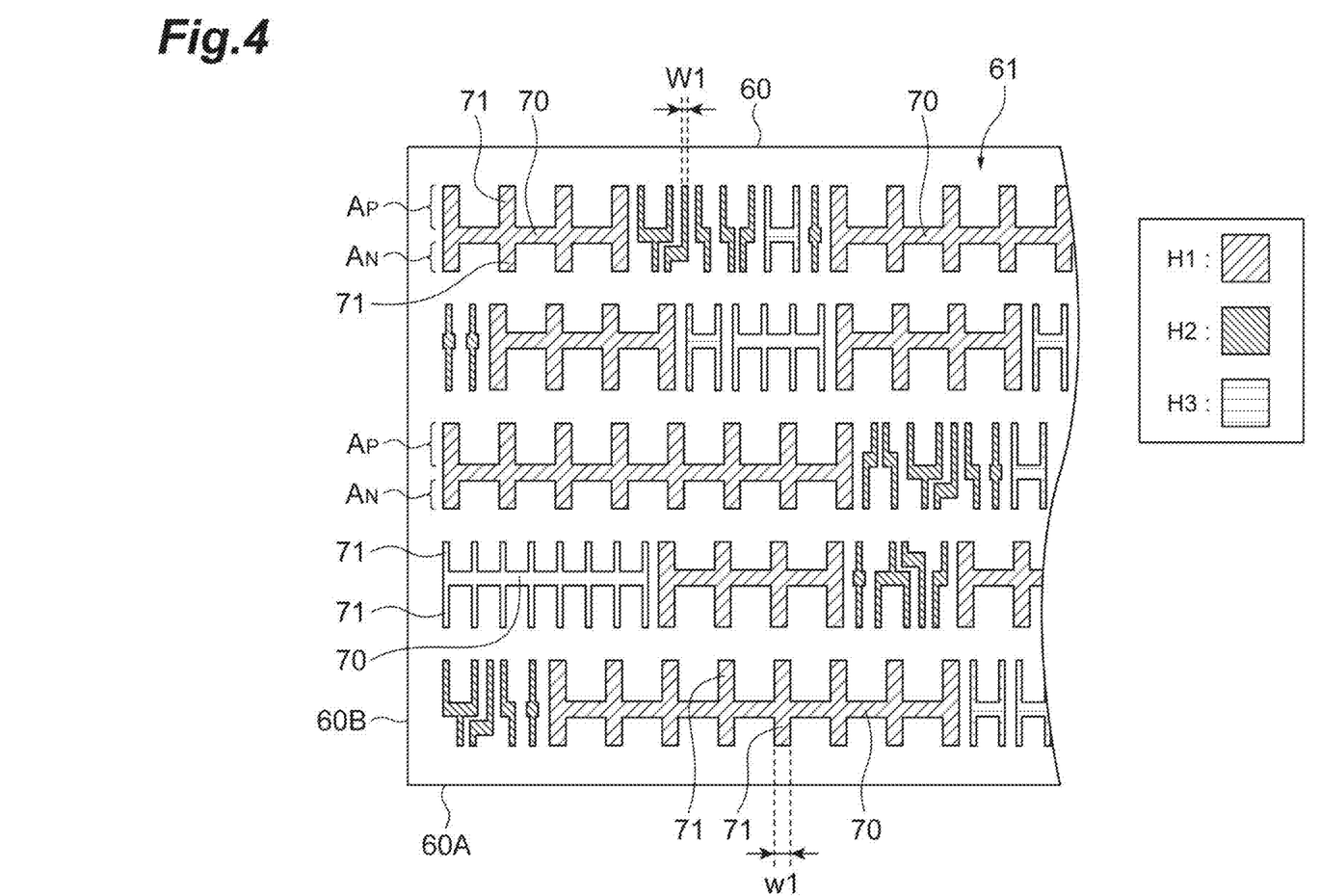
FIG. 4 is a diagram illustrating an image of polygon data included in mask data processed by a search unit 24 illustrated in FIG. 2.
Figure 5:
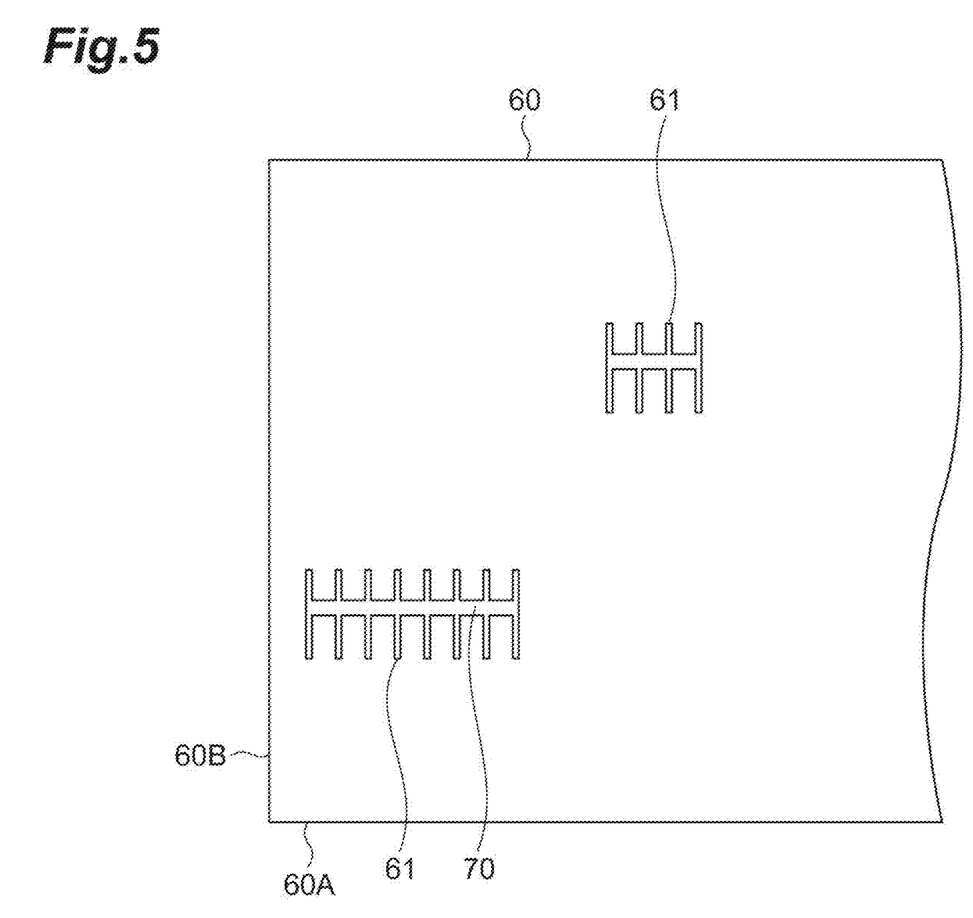
FIG. 5 is a diagram illustrating an image of the polygon data included in the mask data processed by the search unit 24 illustrated in FIG. 2.

FIGS. 4 and 5 are diagrams illustrating the images of the polygon data included in the mask data processed by the search unit 24. As illustrated in FIG. 4, the polygon data indicates the shape and arrangement of polygonal mask patterns 61 on the gate layer based on an outer edge 60 of a semiconductor substrate on which the semiconductor device 10 is constructed. In general, a plurality of rows of the mask patterns 61 are arranged along a side 60A in one direction of the outer edge 60.

First, in a first stage, the search unit 24 recognizes a strip-shaped pattern 70 that extends along the side 60A in each row of the mask pattern 61 on the gate layer. Then, the search unit 24 determines an area that has a large length from the pattern 70 to be a p-channel metal-oxide semiconductor (PMOS) area $A_P$ and determines an area with a small length from the pattern 70 to be an n-channel metal-oxide semiconductor (NMOS) area $A_N$ in each row. In addition, the search unit 24 recognizes a strip-shaped pattern 71 which extends from the strip-shaped pattern 70 along a side 60B which extends in a direction perpendicular to one direction in each of the areas $A_P$ and $A_N$ in each mask pattern 61 on the gate layer and derives a length W1 of the pattern 71 along the side 60A. Then, the search unit 24 extracts a mask pattern 61, of which the length W1 is equal to or smaller than a predetermined value (or is relatively small), and excludes mask patterns 61 other than the extracted mask pattern 61. In FIG. 4, the mask pattern 61 excluded on the basis of the length W1 is represented by a hatched pattern H1. The length W1 corresponds to the gate length of the transistor. The functioning transistor is manufactured so as to have a small gate length and the mask pattern having a relatively large length W1 is a dummy pattern. This is used to extract the mask pattern 61 with a relatively small length W1, which makes it possible to extract the mask pattern 61 corresponding to an effective transistor.

In a second stage, the search unit 24 specifies the number of patterns 71 extending from the pattern 70 to the area $A_P$ or the area $A_N$ on the basis of the patterns 70 and 71 in each mask pattern 61 extracted in the first stage. In this case, the search unit 24 lists the specified number of patterns 71 for each mask pattern 61 and stores the list in a database of a memory such as the RAM 102 of the control device 18. At that time, the content of the list stored in the memory may be output to, for example, a display.

In a third stage, the search unit 24 specifies the total number of patterns 71 extending from the pattern 70 to both the area $A_P$ and the area $A_N$ on the basis of the patterns 70 and 71 in each mask pattern 61 extracted in the second stage with reference to the list stored in the memory in the second stage. A plurality of patterns 71 extending from the same pattern 70 to the area $A_P$ and the area $A_N$ correspond to gate layers which are connected to each other through a contact layer corresponding to the pattern 70. Then, the search unit 24 excludes a mask pattern 61 in which the specified total number of patterns is equal to or less than a predetermined threshold value. For example, when a mask pattern 61 in which the total number of patterns is equal to or greater than 5 is extracted, the threshold value is set to 4. That is, since the mask pattern 61 in which the total number of patterns 71 is equal to or less than the threshold value is determined to be a pattern corresponding to a transistor with a relatively low driving capability, it is excluded from the extraction target. In FIG. 4, a mask pattern 61 which has been excluded since the number of patterns 71 is 1 is represented by a hatched pattern H2 and a mask pattern 61 which has been excluded since the total number of patterns 71 is equal to or less than the threshold value is represented by a hatched pattern H3. Incidentally, the search unit 24 may operate such that the mask pattern 61 extracted in the third stage is displayed so as to be highlighted in the list output on the display.

The search unit 24 performs the extraction in the first to third stages to search for the position of a mask pattern 61 including a gate layer corresponding to the position of a transistor with a relatively high driving capability in a coordinate system (hereinafter, referred to as a substrate coordinate system) based on the semiconductor substrate of the semiconductor device 10. FIG. 5 illustrates the mask pattern 61 finally extracted by the search unit 24. Then, the search unit 24 determines the position of a transistor with a relatively high driving capability from the searched position of the mask pattern 61. For example, the search unit 24 determines, as the position of the transistor, the coordinates of both ends (for example, a lower right end and an upper left end) or the center of any pattern 70 in the extracted mask pattern 61 in the substrate coordinate system.

Returning to FIG. 2, the setting unit 25 sets optical measurement positions on the basis of the positions of a plurality of transistors searched by the search unit 24. That is, the setting unit 25 transforms the coordinates of the plurality of transistors in the substrate coordinate system into coordinates in a coordinate system (hereinafter, referred to as a measurement coordinate system) treated by the beam scanning controller 21 and the tester unit 22. This method compares a characteristic pattern of an image in the substrate coordinate system with a corresponding characteristic pattern in the measurement coordinate system and makes the coordinate systems correspond to each other. A transform coefficient for correspondence is calculated by this operation and the coordinates transformed by this coefficient are set as the optical measurement position. Incidentally, the semiconductor device inspection apparatus 1 may be separately provided with an imaging device, such as a CMOS camera or an InGaAs camera, for acquiring a two-dimensional image of the semiconductor device 10 and may dynamically transform the coordinates of the transistor into the coordinates in the measurement coordinate system on the semiconductor device 10 on the basis of the two-dimensional pattern image of the semiconductor device 10 acquired in advance by the imaging device.

Figure 6:
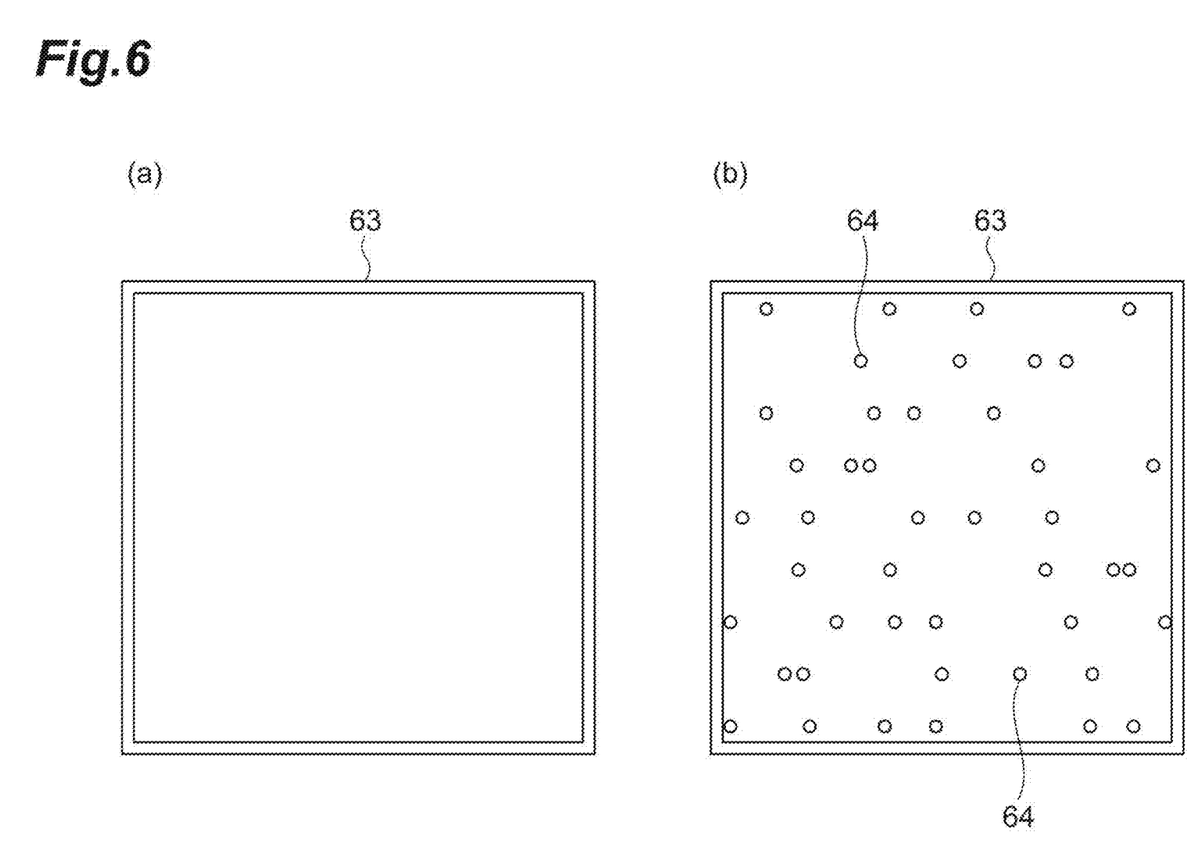
FIG. 6 is a diagram illustrating an image of optical measurement positions set in a measurement coordinate system by a setting unit 25 illustrated in FIG. 2.

FIG. 6 illustrates the image of the optical measurement position set in the measurement coordinate system by the setting unit 25. The setting unit 25 sets the position of a semiconductor substrate 63 of the semiconductor device 10 in the measurement coordinate system (a portion (a) of FIG. 6) and sets a plurality of optical measurement positions 64 on the semiconductor substrate 63 in the measurement coordinate system (a portion (b) of FIG. 6).

Returning to FIG. 2, the measurement unit 26 controls the beam scanning controller 21 on the basis of the optical measurement positions set by the setting unit 25. At the same time, the measurement unit 26 starts the application of an electric signal by the tester unit 22 to perform optical measurement. Specifically, the measurement unit 26 outputs an instruction signal for instructing the optical measurement position to the beam scanning controller 21 such that light is emitted to the optical measurement position in the semiconductor device 10 and a detection signal of reflected light from the position is output. The optical measurement at one position is continued for a predetermined period of time while applying an electric signal to the semiconductor device 10.

Further, the measurement unit 26 repeatedly performs the optical measurement for each of the plurality of optical measurement positions set by the setting unit 25. In addition, the measurement unit 26 acquires waveform data of a temporal change in the intensity of the reflected light for each optical measurement position on the basis of the detection signal for each optical measurement position obtained by the optical measurement.

Figure 7:
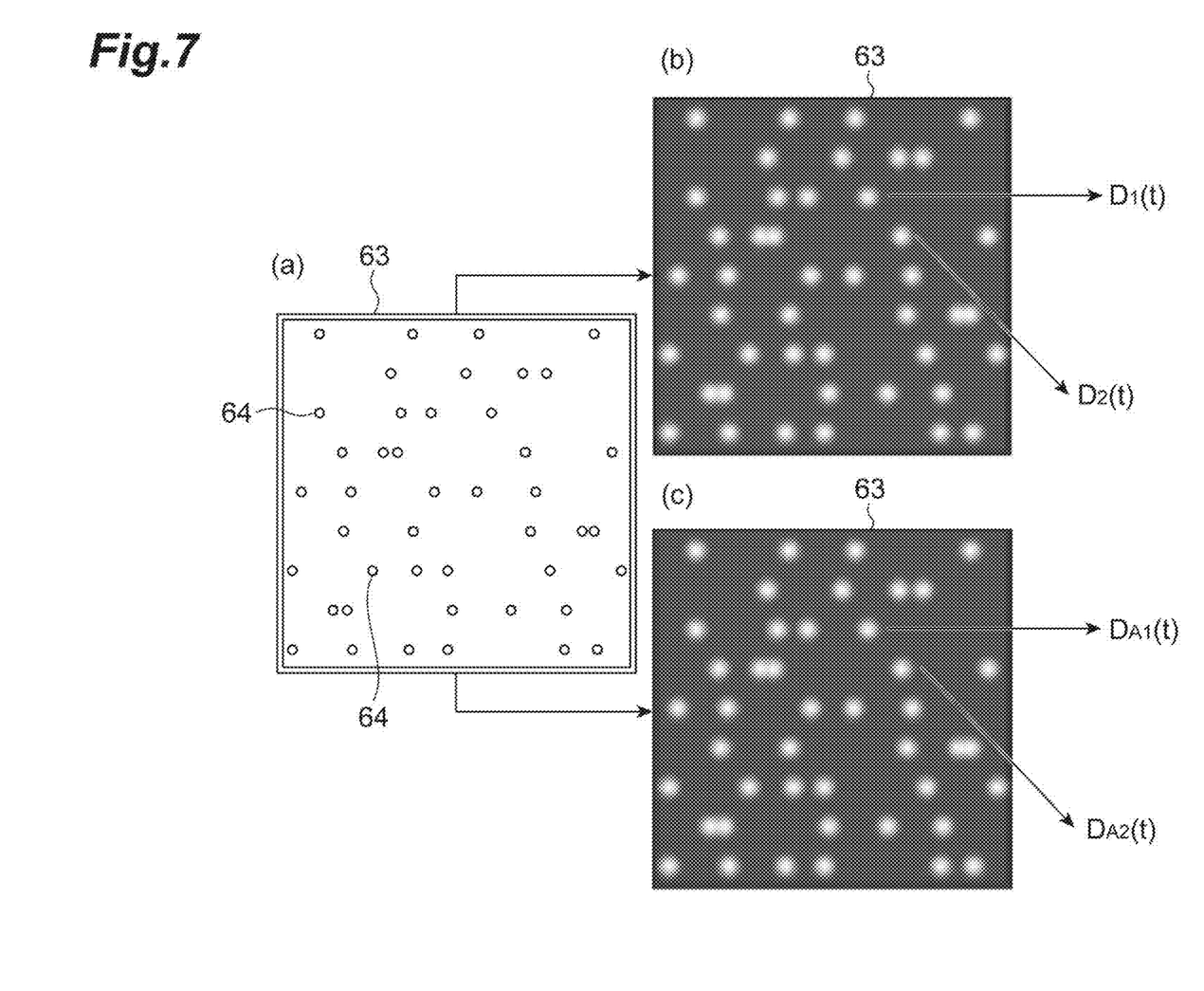
FIG. 7 is a diagram illustrating an image of reflected light detected by a measurement unit 26 illustrated in FIG. 2.

FIG. 7 illustrates an image of the reflected light detected by the measurement unit 26. The measurement unit 26 performs optical measurement for the plurality of optical measurement positions 64 (a portion (a) of FIG. 7) on the semiconductor substrate 63 of the semiconductor device 10 set by the setting unit 25, performs optical measurement for a defective semiconductor device 10 to acquire waveform data items $D_1(t)$ and $D_2(t)$ of the intensity of reflected light corresponding to a plurality of optical measurement positions (a portion (b) FIG. 7), and performs optical measurement for a non-defective semiconductor device 10 to acquire waveform data items $D_{A1}(t)$ and $D_{A2}(t)$ of the intensity of reflected light corresponding to a plurality of optical measurement positions (a portion (c) of FIG. 7).

Returning to FIG. 2 again, the output unit 27 generates measurement results, using the waveform data for each optical measurement position generated by the measurement unit 26 and outputs the measurement results to the input/output device 106, such as a display, or an external device. For example, the output unit 27 generates correspondence degree data indicating the degree of correspondence between waveform data items for each of the plurality of optical measurement positions, using the waveform data generated for the defective semiconductor device 10 and the waveform data generated for the non-defective semiconductor device 10. Examples of the method of calculating the degree of correspondence include a method of evaluating whether or not the rising and falling timings of light intensity in the waveform data correspond to each other and a method of comparing light intensity at the timing of a predetermined period with a threshold value and evaluating whether or not the comparison results correspond to each other.

Figure 8:
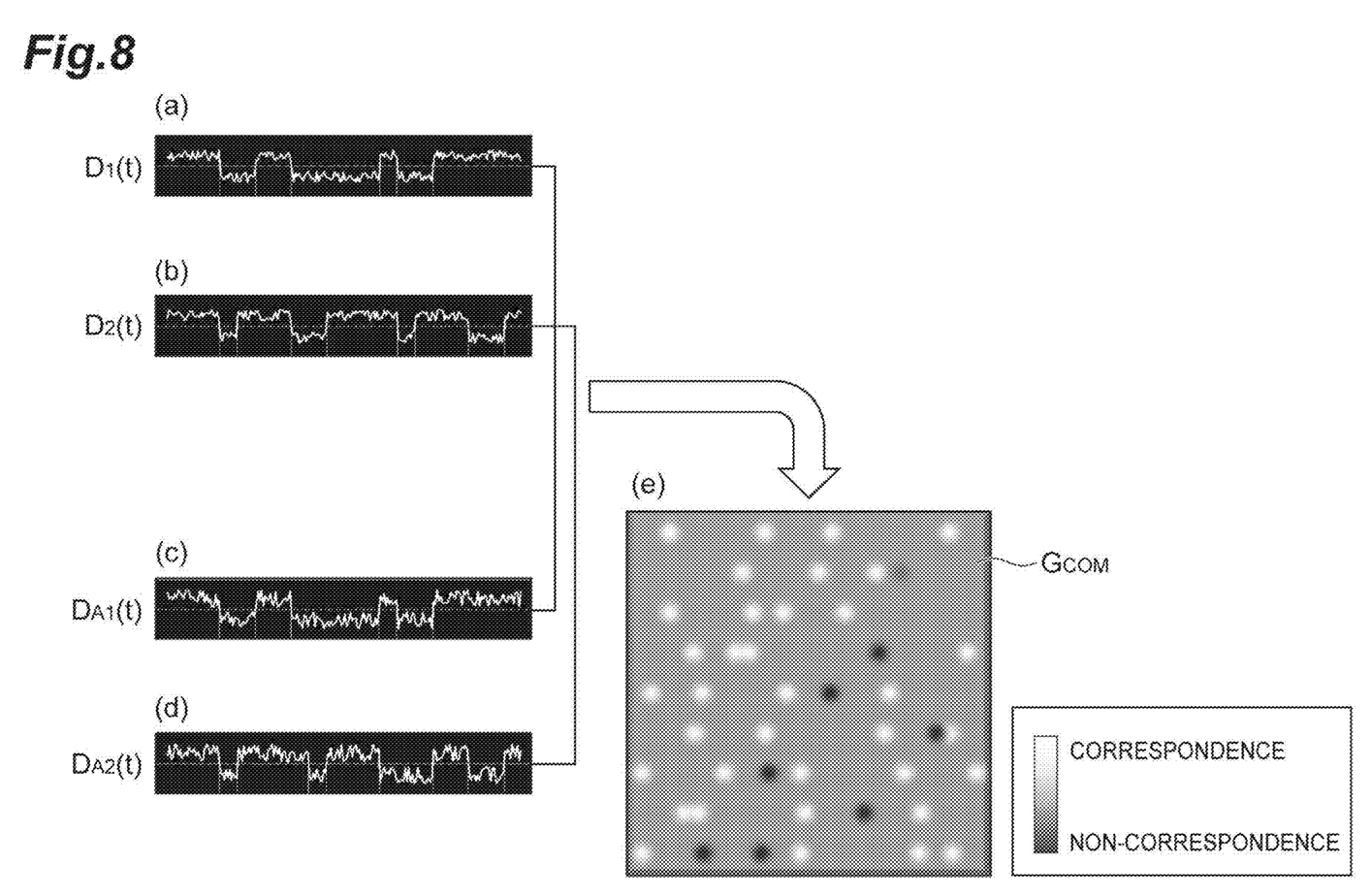
FIG. 8 is a diagram illustrating an image of correspondence degree data output by an output unit 27 illustrated in FIG. 2.

FIG. 8 illustrates an image of the correspondence degree data output by the output unit 27. The output unit 27 compares data items corresponding to the same optical measurement position in the waveform data items $D_1(t)$ and $D_2(t)$ (a portion (a) of FIG. 8 and a portion (b) of FIG. 8) of the defective semiconductor device 10 and the waveform data items $D_{A1}(t)$ and $D_{A2}(t)$ (a portion (c) of FIG. 8 and a portion (d) of FIG. 8) of the non-defective semiconductor device 10 generated by the measurement unit 26 to calculate the degree of correspondence. In this case, when the correspondence between the optical measurement position in the measurement coordinate system at the time of the optical measurement for the defective semiconductor device 10 and the optical measurement position in the measurement coordinate system at the time of the optical measurement for the non-defective semiconductor device 10 is made, a method (see WO2015/098343A) using coordinate transform information, such as matching information derived on the basis of both images, is applied. In addition, in this case, a procedure used when the coordinates in the substrate coordinate system of the semiconductor device 10 described above are transformed into coordinates in the measurement coordinate system may be used for the correspondence between the optical measurement position in the measurement coordinate system at the time of the optical measurement for the defective semiconductor device 10 and the optical measurement position in the measurement coordinate system at the time of the optical measurement for the non-defective semiconductor device 10. Further, the output unit 27 generates and outputs, as the measurement result, two-dimensional image data $G_{COM}$ (a portion (e) of FIG. 8) in which the degree of correspondence between the waveform data items at each optical measurement position is represented by shading.

Here, the output unit 27 is not limited to the configuration in which it outputs the correspondence degree data as the measurement result and may output the waveform data without any change. In addition, the output unit 27 may perform the following process and output the measurement result. For example, the output unit 27 determines the connection between a plurality of optical measurement positions using the mask data, tracks the optical measurement positions in a direction that is expected to be an upstream direction with respect to a signal flow on the basis of the determined connection, and continuously perform the tracking up to the position where the degree of correspondence is greater than a predetermined threshold value. In this case, the connection is determined by generating a circuit diagram on the semiconductor device 10 on the basis of the mask data using a known method and using the circuit diagram. For example, a position with a relatively low degree of correspondence in a lower left part on the semiconductor substrate of the semiconductor device 10 is set as a connection tracking start point. Then, the output unit 27 performs control through the measurement unit 26 to acquire detailed waveform data of the defective semiconductor device 10 for the position of an end point when the tracking ends and a plurality of positions immediately before the end of the tracking again and outputs the waveform data together with data indicating the optical measurement positions in the substrate coordinate system.

Figure 9:
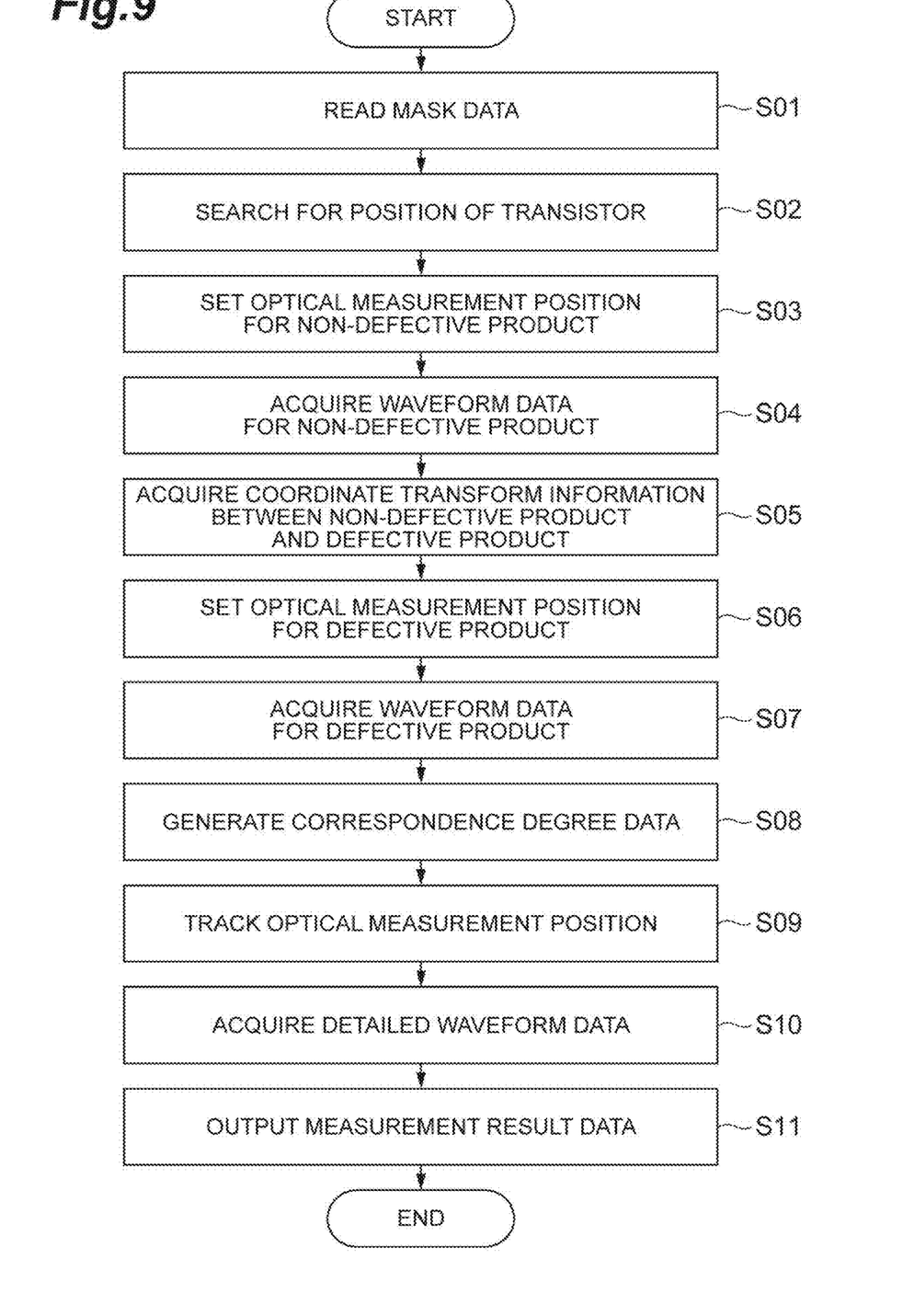
FIG. 9 is a flowchart illustrating the procedure of an optical measurement operation of the semiconductor device inspection apparatus 1 according to the embodiment.

Next, the optical measurement operation of the semiconductor device inspection apparatus 1 will be described and the flow of an optical measurement method according to an embodiment will be described in detail. FIG. 9 is a flowchart illustrating the procedure of the optical measurement operation of the semiconductor device inspection apparatus 1.

First, when optical measurement is started by the input of an instruction from the operator of the semiconductor device inspection apparatus 1, the data reading unit 23 of the control device 18 reads mask data related to the semiconductor device 10 (Step S01; a data reading step). Then, the search unit 24 of the control device 18 searches for the position of a transistor with a relatively high driving capability in the semiconductor device 10 (Step S02; a search step). Then, a non-defective semiconductor device 10 is set in the semiconductor device inspection apparatus 1 and the setting unit 25 of the control device 18 sets optical measurement positions on the semiconductor device 10 in the measurement coordinate system (Step S03; a setting step). Then, the measurement unit 26 of the control device 18 controls the execution of optical measurement for the set optical measurement positions and acquires the waveform data of the intensity of reflected light for each optical measurement position (Step S04; a measurement step).

Then, a defective semiconductor device 10 is set in the semiconductor device inspection apparatus 1 and the control device 18 acquires coordinate transform information for the correspondence between the optical measurement position in the measurement coordinate system at the time of optical measurement for the non-defective semiconductor device 10 and the optical measurement position in the measurement coordinate system at the time of optical measurement for the defective semiconductor device 10 (Step 505). Then, the setting unit 25 of the control device 18 sets an optical measurement position on the semiconductor device 10 in the measurement coordinate system (Step S06; a setting step). Then, the measurement unit 26 of the control device 18 controls the execution of optical measurement for the set optical measurement position and acquires the waveform data of the intensity of reflected light for each optical measurement position (Step S07; a measurement step).

In addition, the output unit 27 of the control device 18 generates correspondence degree data indicating the degree of correspondence for each of a plurality of optical measurement positions on the basis of the waveform data of the non-defective semiconductor device and the defective semiconductor device (Step S08). Then, the output unit 27 tracks the optical measurement position using the correspondence degree data (Step S09). Then, the output unit 27 sets a plurality of optical measurement positions on the basis of the tracking results and acquires the detailed waveform data of the intensity of reflected light at the optical measurement positions (Step S10). Finally, the output unit 27 associates the acquired detailed waveform data with corresponding data indicating the optical measurement positions in the substrate coordinate system and outputs the associated data (Step S11).

Figure 10:
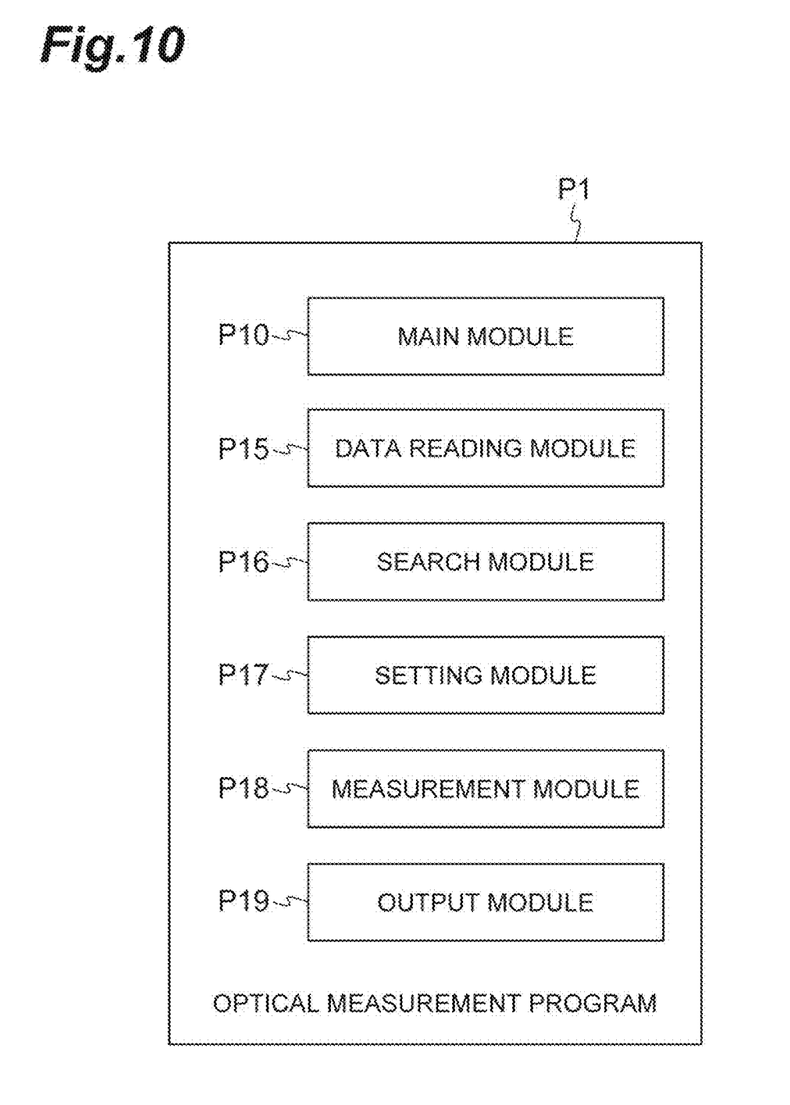
FIG. 10 is a block diagram illustrating the configuration of an optical measurement program according to an embodiment.

Next, an optical measurement program for causing a computer to function as the control device 18 of the semiconductor device inspection apparatus 1 will be described with reference to FIG. 10.

An optical measurement program P1 includes a main module P10, a data reading module P15, a search module P16, a setting module P17, a measurement module P18, and an output module P19.

The main module P10 is a portion that controls the overall optical measurement. Functions implemented by executing the data reading module P15, the search module P16, the setting module P17, the measurement module P18, and the output module P19 are the same as the functions of the data reading unit 23, the search unit 24, the setting unit 25, the measurement unit 26, and the output unit 27 of the control device 18, respectively.

The optical measurement program P1 is provided by a computer-readable recording medium, such as a CD-ROM, a DVD, or a ROM, or a semiconductor memory. In addition, the optical measurement program P1 may be provided as computer data signals superimposed on a carrier wave through a network.

According to the semiconductor device inspection apparatus 1 and the optical measurement method using the semiconductor device inspection apparatus 1 which have been described above, the position of a transistor with a relatively high driving capability in the semiconductor device 10 is searched using the polygon data related to the gate layer that is included in the mask data related to the semiconductor device 10 which is a DUT. Then, the searched position is set as an optical measurement target position and optical measurement using EOP is performed for the set position. A change in the intensity of reflected light due to a variation in a region of a depletion layer according to a change in the gate voltage in the transistor of the semiconductor device 10, to which a predetermined electric signal has been applied, is measured by EOP. Therefore, even in a case in which the operator has only mask data, it is possible to appropriately set a part which is to be measured or is easy to measure in order to perform defect analysis for the semiconductor device 10. As a result, it is possible to easily analyze a defective part using the measurement results.

In particular, in the semiconductor device inspection apparatus 1, a position corresponding to the pattern of a gate layer having a relatively small gate length is extracted as a candidate of the position of the transistor from the mask pattern in order to distinguish the pattern from a dummy pattern. In this case, it is possible to appropriately extract the position of the functioning transistor. As a result, it is possible to more appropriately set a part which is to be measured or is easy to measure in order to perform defect analysis for the semiconductor device 10.

In addition, in the semiconductor device inspection apparatus 1, the position of a transistor with a relatively high driving capability is searched from the mask pattern on the basis of the number of patterns of the gate layers that are connected to each other. In this case, it is possible to reliably extract the position of the transistor with a high driving capability. As a result, it is possible to more appropriately set a part which is to be measured or is easy to measure in order to perform defect analysis for the semiconductor device 10.

Further, in the semiconductor device inspection apparatus 1, the waveform data of the intensity of reflected light is acquired as the measurement result. This function makes it possible to easily perform defect analysis for the semiconductor device 10.

Various embodiments of the present invention have been described above. However, the present invention is not limited to the above-described embodiments and may be modified without departing from the scope and spirit described in the claims or may be applied to other configurations.

In addition, in the above-described embodiments, the light source 2 is not necessarily provided and optical measurement for the semiconductor device 10 may be performed by measuring light emission at the optical measurement position. For example, in the semiconductor device inspection apparatus 1, optical measurement using TRIEM may be performed. In the transistors in the semiconductor device 10, light emission corresponding to hot carriers which travel between the source and the drain at the timing when a gate voltage changes between a high voltage and a low voltage is detected by TRIEM.

However, in the semiconductor device inspection apparatus 1 having the function of performing optical measurement using TRIEM, the waveform data of light emission intensity acquired by the measurement unit 26 includes a spike at the light emission timing of the transistor. Therefore, the semiconductor device inspection apparatus 1 has a function of calculating the degree of correspondence as follows. That is, the output unit 27 of the control device 18 detects a plurality of timings when a spike greater than a predetermined threshold value is generated in the waveform data of light emission intensity acquired by the measurement unit 26 and evaluates the correspondence/non-correspondence between the plurality of generation timings to generate correspondence degree data. In this case, the correspondence/non-correspondence between the generation timings may be evaluated as follows in order to remove the influence of jitter in the measurement system: when the deviation between the generation timings is equal to or less than a predetermined period such as half of the clock cycle of the measurement system, it is evaluated that the generation timings correspond to each other.

In addition, some of the functions of the data reading unit 23, the search unit 24, and the setting unit 25 of the control device 18 according to the above-described embodiment may be assigned to an external device other than the control device 18. At that time, the external device is, for example, another control device called a layout viewer in which software for operating the mask data operates. In this case, data, such as the designation of the search region and the optical measurement position, is transmitted through communication or a recording medium. Further, the functions of the output unit 27 of the control device 18 may be assigned to an external control device. That is, the function of tracking the connection between the optical measurement positions may be assigned. This configuration makes it possible to perform connection tracking in parallel to the optical measurement performed by the semiconductor device inspection apparatus 1 and to shorten the analysis time. In addition, for the assignment of the functions, the calculation of the degree of correspondence may be performed by any of the above-described control devices and an appropriate function assignment system may be constructed according to the performance of the control device or the procedure of the process to be performed.

In the above-described embodiments, preferably, in the search step, a position of a transistor with a relatively high driving capability in the semiconductor device is searched as the position of the transistor. In another aspect described above, preferably, the search means searches for a position of a transistor with a relatively high driving capability in the semiconductor device as the position of the transistor. In this case, it is possible to more appropriately set a part which is to be measured or is easy to measure in order to perform defect analysis for a semiconductor device.

In addition, preferably, in the search step, a position corresponding to a pattern of a gate layer with a relatively small gate length is extracted as a candidate of the position of the transistor from the polygon data. Preferably, the search means extracts a position corresponding to a pattern of a gate layer with a relatively small gate length as a candidate of the position of the transistor from the polygon data. In this case, it is possible to appropriately extract the position of the transistor. As a result, it is possible to more appropriately set a part which is to be measured or is easy to measure in order to perform defect analysis for a semiconductor device.

Further, preferably, in the search step, the position of the transistor with the relatively high driving capability is searched from the polygon data on the basis of the number of patterns of gate layers connected to each other. Preferably, the search means searches for the position of the transistor with the relatively high driving capability from the polygon data on the basis of the number of patterns of gate layers connected to each other. In this case, it is possible to reliably extract the position of a transistor with a high driving capability. As a result, it is possible to more appropriately set a part which is to be measured or is easy to measure in order to perform defect analysis for a semiconductor device.

Furthermore, preferably, in the measurement step, waveform data of light intensity is acquired as the measurement result. Preferably, the measurement means acquires waveform data of light intensity as the measurement result. This configuration makes it possible to easily perform defect analysis for a semiconductor device.

In addition, preferably, in the measurement step, light is emitted to the optical measurement target position in the semiconductor device to which a test signal has been input and reflected light from the optical measurement target position in the semiconductor device is measured. In another aspect described above, preferably, the optical measurement apparatus further includes: a light source configured to emit light; and an optical scanning unit configured to scan the semiconductor device with the light emitted from the light source. Preferably, the measurement means of the control device controls the optical scanning unit such that light is emitted to the optical measurement target position in the semiconductor device and measures reflected light from the optical measurement target position in the semiconductor device. According to this configuration, reflected light generated by emitting light to the set position in the semiconductor device is measured to easily perform defect analysis for a semiconductor device.

Further, preferably, in the measurement step, light emission from the optical measurement target position in the semiconductor device to which a test signal has been input is measured. Preferably, the measurement means of the control device measures light emission from the optical measurement target position in the semiconductor device. In a case in which this configuration is adopted, light emission from the set position in a semiconductor device is measured to easily perform defect analysis for the semiconductor device.

INDUSTRIAL APPLICABILITY

The embodiments are used for an optical measurement method, an optical measurement apparatus, an optical measurement program, and a recording medium having the optical measurement program recorded thereon which perform optical measurement for a semiconductor device and can appropriately set an optical measurement target position to easily perform defect analysis for a semiconductor device.

REFERENCE SIGNS LIST

1: semiconductor device inspection apparatus, 2: light source, 7: scanning optical system (optical scanning unit), 8: scanning head, 9: lens system, 10: semiconductor device, 11: optical fiber (optical system), 12: light sensor (light detector), 18: control device, 23: data reading unit (data reading means), 24: search unit (search means), 25: setting unit (setting means), 26: measurement unit (measurement means).

The invention claimed is:

1. An optical measurement method for performing optical measurement for a semiconductor device, the method comprising:
    reading mask data indicating a mask layout of the semiconductor device;
    searching for a position of a transistor in the semiconductor device on the basis of polygon data indicating a pattern and arrangement of a gate layer in the semiconductor device, the polygon data being included in the mask data;
    setting the searched position of the transistor searched in the search step as an optical measurement target position; and
    performing the optical measurement for the set optical measurement target position to acquire a measurement result.

2. The optical measurement method according to claim 1, wherein, in the searching, a position of a transistor with a relatively high driving capability in the semiconductor device is searched as the position of the transistor.

3. The optical measurement method according to claim 1, wherein, in the searching, a position corresponding to a pattern of a gate layer with a relatively small gate length is extracted as a candidate of the position of the transistor from the polygon data.

4. The optical measurement method according to claim 2, wherein, in the searching, the position of the transistor with the relatively high driving capability is searched from the polygon data on the basis of the number of patterns of gate layers connected to each other.

5. The optical measurement method according to claim 1, wherein, in the optical measurement, waveform data of light intensity is acquired as the measurement result.

6. The optical measurement method according claim 1, wherein, in the optical measurement, light is emitted to the optical measurement target position in the semiconductor device to which a test signal has been input and reflected light from the optical measurement target position in the semiconductor device is measured.

7. The optical measurement method according to claim 1, wherein, in the optical measurement, light emission from the optical measurement target position in the semiconductor device to which a test signal has been input is measured.

8. An optical measurement apparatus performing optical measurement for a semiconductor device, the apparatus comprising:
    a light detector configured to detect light from the semiconductor device to which a test signal has been input;
    an optical system for guiding light from the semiconductor device to the light detector; and
    a control device being electrically connected to the light detector,
    wherein the control device is configured to:
    read mask data indicating a mask layout of the semiconductor device;
    search for a position of a transistor in the semiconductor device on the basis of polygon data indicating a pattern and arrangement of a gate layer in the semiconductor device, the polygon data being included in the mask data;
    set the position of the transistor searched by the search means as an optical measurement target position; and
    perform the optical measurement for the set optical measurement target position to acquire a measurement result.

9. The optical measurement apparatus according to claim 8, wherein the control device searches for a position of a transistor with a relatively high driving capability in the semiconductor device as the position of the transistor.

10. The optical measurement apparatus according to claim 8, wherein the control device extracts a position corresponding to a pattern of a gate layer with a relatively small gate length as a candidate of the position of the transistor from the polygon data.

11. The optical measurement apparatus according to claim 9, wherein the control device searches for the position of the transistor with the relatively high driving capability from the polygon data on the basis of the number of patterns of gate layers connected to each other.

12. The optical measurement apparatus according to claim 8, wherein the control device acquires waveform data of light intensity as the measurement result.

13. The optical measurement apparatus according to claim 8, further comprising:
    a light source configured to emit light; and
    an optical scanning unit configured to scan the semiconductor device with the light emitted from the light source,
    wherein the control device controls the optical scanning unit such that light is emitted to the optical measurement target position in the semiconductor device and measures reflected light from the optical measurement target position in the semiconductor device.

14. The optical measurement apparatus according to claim 8, wherein the control device measures light emission from the optical measurement target position in the semiconductor device.

15. A non-transitory computer-readable medium on which an optical measurement program is stored, the optical measurement program, when executed by a computer, causes the computer to perform steps of:
    reading mask data indicating a mask layout of a semiconductor device;
    searching for a position of a transistor in the semiconductor device on the basis of polygon data indicating a pattern and arrangement of a gate layer in the semiconductor device, the polygon data being included in the mask data;
    setting the position of the transistor searched by the search means as an optical measurement target position; and
    performing optical measurement for the set optical measurement target position to acquire a measurement result.

* * * * *